United States Patent [19]

Winthrop

[11] Patent Number: 4,516,816
[45] Date of Patent: May 14, 1985

[54] IN CIRCUIT MODIFICATION DEVICE FOR DUAL IN LINE PACKAGED COMPONENTS

[76] Inventor: Michael F. Winthrop, 727 W. Holly Ave., Sterling, Va. 22170

[21] Appl. No.: 455,714

[22] Filed: Jan. 5, 1983

[51] Int. Cl.³ ............................................. H05K 1/00
[52] U.S. Cl. ............................ 339/17 CF; 339/17 C; 339/17 M; 339/176 MP
[58] Field of Search .......... 339/17 C, 17 LC, 17 LM, 339/17 M, 17 R, 176 MP, 17 CF

[56] References Cited

U.S. PATENT DOCUMENTS

| | | | |
|---|---|---|---|
| 3,409,862 | 11/1968 | Lynch et al. | 339/17 LC |
| 3,486,160 | 12/1969 | Wallace | 339/17 C |
| 3,644,792 | 2/1972 | Fields | 339/17 C |
| 3,670,207 | 6/1972 | Seabury | 339/17 LC |
| 3,876,274 | 4/1975 | Reuhlemann et al. | 339/17 LC |
| 4,025,147 | 5/1977 | Van Arsdale et al. | 339/17 LC |
| 4,157,207 | 6/1979 | Robinson | 339/17 C |

Primary Examiner—Gil Weidenfeld
Assistant Examiner—David L. Pirlot
Attorney, Agent, or Firm—Donald J. Singer; Willard R. Matthews

[57] ABSTRACT

In circuit modifications of dual in line packaged (DIP) devices are realized by a circuit modification device that interfaces the DIP and its companion device. A first pair of single in line packaged (DIP) header pins are mounted on a printed circuit (PC) board such that they form a socket for the DIP device. A second pair of SIP header pins are mounted adjacent to the first pair and extend through the PC board to form a plug for the companion device. Header pins are interconnected by the printed circuit to effect the desired DIP device circuit reconfiguration. Packaging is accomplished with commercially available components and does not impact system size, weight or power constraints.

5 Claims, 7 Drawing Figures

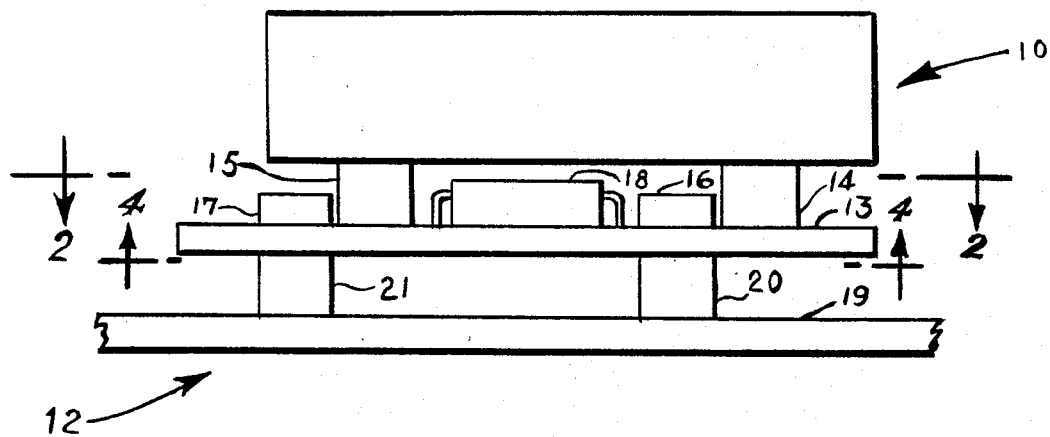
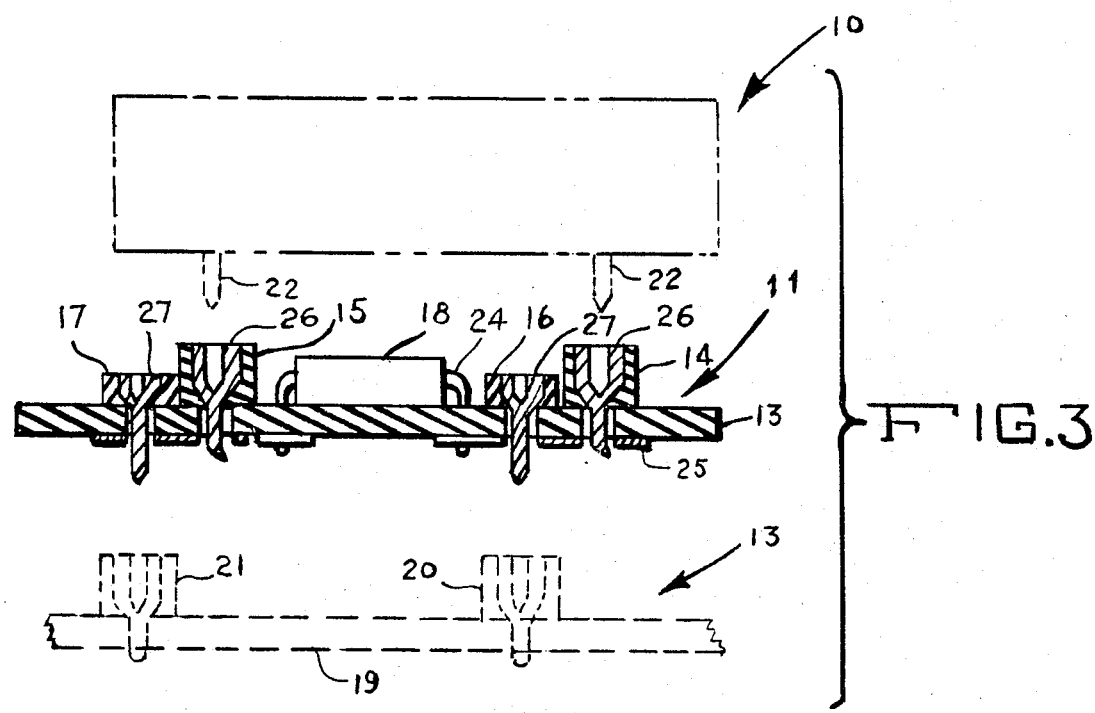

MEMORY MAP TRS 80

| BEFORE | | AFTER |
|---|---|---|
| C | C000 | SCRN / ROM |
| B | 8000 | A |
| A | 4000 | B |
| SCRN / ROM | 0000 | C |

7474 FUNCTION TRUTH TABLE

| IN | | | | OUT | |
|---|---|---|---|---|---|
| PRE | CLR | CLK | D | Q | Q̄ |
| H | H | ↑ | H | H | L |
| H | H | ↑ | L | L | H |

IN CIRCUIT MODIFICATION DEVICE FOR DUAL IN LINE PACKAGED COMPONENTS

STATEMENT OF GOVERNMENT INTEREST

The invention described herein may be manufactured and used by or for the Government for governmental purposes without the payment of any royalty thereon.

BACKGROUND OF THE INVENTION

This invention relates to dual in line packaged (DIP) devices and, in particular, to a circuit modification device that allows replacement of a DIP with a similar sized enhancement in an existing fielded piece of equipment.

DIP devices, such as large scale integration components, e.g. microprocessors and the like, are completely packaged by the manufacturers and in-circuit modifications (modifications within the packaged circuit itself) heretofore have not been possible. Currently, in order to change a chip junction in a circuit that is already fielded it is necessary to either rebuild the entire circuit or discard and replace valuable still useable components. One current problem is that of fixed address space in microcomputers. For instance, it is not presently possible to remap the memory in a TRS-80 microcomputer without bulky hardware modifications. It is also desirable to add logic functions by means of integrated circuit (IC) components. The reconfiguration of computer memory and the addition of IC circuit components therefore currently entails extraneous circuit additions, relatively long lead lines, and additional space requirements. These, in turn, result in additional problems. For military applications, where rugged fixed in position components are required hard soldering of all of the electronics necessary to implement the required hardware modification is not always possible. In other aplications the additional length of lead lines can cause problems in operation because of timing pulse delays. Such long wire additions introduce electrical emanation problems as well as inter circuit capacitance and inductance which could produce errors in processing. Furthermore, such additions are expensive and do not meet manufacturer's specifications for size, space and power. The current practice is to replace rather than upgrade existing equipment. The economic price paid for this approach is obvious and sometimes prohibitive. There currently exists, therefore, the need for a DIP circuit modification device that can provide in-circuit reconfiguration of fielded components inexpensively and in compliance with manufacturers size, space and power specifications. The present invention is directed toward satisfying that need.

SUMMARY OF THE INVENTION

The invention is a circuit modification device that permits in-circuit changes and the addition of integrated circuit (IC) components in dual in line packaged (DIP) devices without exceeding manufacturer's size, space and power specifications. The circuit modification device is fabricated of two sets of single in line packaged (SIP) header pin devices and a printed circuit (PC) board. The SIP header pin devices are mounted on the PC board and arranged such that one set constitutes a socket for the DIP device and the other set constitutes a plug that replaces the original DIP device terminal pins. Integrated circuit components are also mounted on the PC board between SIP header pin devices. The entire arrangement is packaged to conform to standard DIP device space and size requirements. The individual pins of each SIP header pin set, and the IC component pins are inter-connected by a printed circuit that effects the desired DIP device in-circuit re-configuration. In a specific embodiment of the invention, a Z80 microprocessor for use with a TRS-80 microcomputer is upgraded to reflect some of the Z800's memory-mapping abilities. Integrated circuit components consisting of a D flip flop (7474) and a three state buffer inverter (74368) are incorporated in the circuit and 16,364 byte memory blocks of the TRS-80 are remapped.

It is a principal object of the invention to provide a new and improved in-circuit modification device for use with fielded DIP devices.

It is another object of the invention to provide a DIP in-circuit modification device that conforms to manufacturers specifications for size, space and power.

It is another object of the invention to provide a DIP in-circuit modification device that is inexpensive, easy to utilize and can be fabricated from readily available off the shelf components.

It is another object of the invention to provide a DIP in-circuit modification device in which all components are hand soldered in place and that meets ruggedness standards set for military applications.

It is another object of the invention to provide a DIP in-circuit modification device that incorporates multiple IC components and is packaged to conform to standard DIP device space requirements.

It is another object of the invention to provide a DIP technique that can be used to up-grades a Z80 microprocesssor to a Z800 microprocessor for use with a TRS 80 microcomputer.

These, together with other objects, features and advantages of the invention will become more readily apparent from the following detailed description when taken in conjunction with the illustrative embodiment in the accompanying drawings.

DESCRIPTION OF THE DRAWINGS

FIG. 1 is an end view of the circuit modification device of the inventor shown in interfacing relationship with a microprocessor and a microcomputer;

FIG. 3 is a sectional view of FIG. 2 taken at 3—3 illustrating the in-circuit modification device of the invention in section and the microprocessor and the microcomputer in phantom;

DETAILED DESCRIPTION OF THE PREFERRED EMBODIMENT

Figure 2:
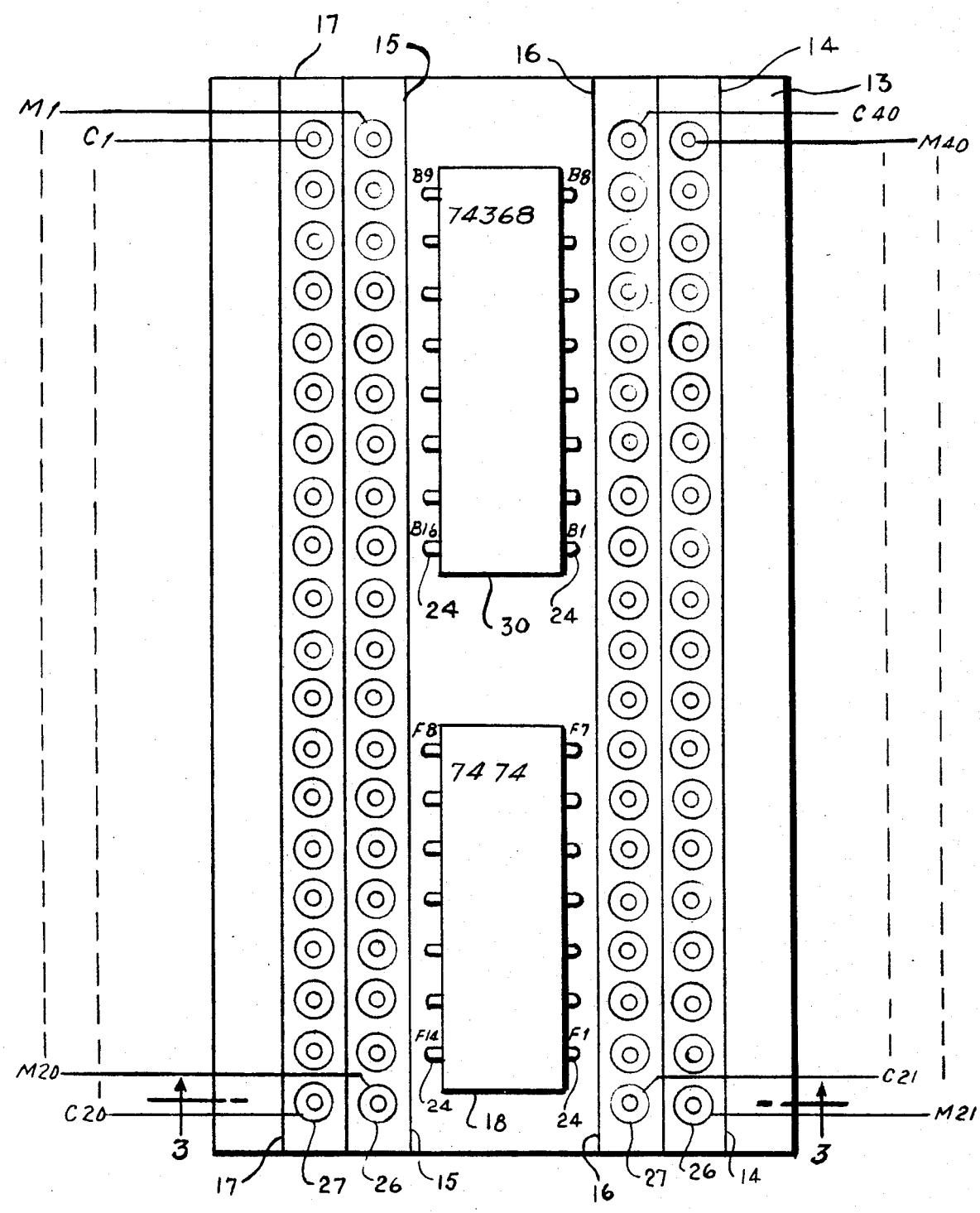
FIG. 2 is a sectional view taken at 2—2 of the device shown in FIG. 1 illustrating a top view of the circuit modification device of the invention.

The invention relates to a packaging concept that organizes single in line packaged (SIP) header pin devices and IC components on a printed circuit board in a manner that provides an interface unit that can be inserted between a dual in line package (DIP) device (microprocessor) and its companion device (microcomputer) without adversely impacting manufacturers size and space specifications. The invention thus allows limited in-circuit modifications in the limited space of existing dual inline packaged (DIP) devices. The physical implementation is uniquely useful where an old circuit design needs to be upgraded for a new part replacement. In the embodiment of the invention described herein by way of example 16,364 byte memory blocks in (Tandy)TRS-80 microcomputer are remapped. Mechanically, a single inline package (SIP) soldertail socket is placed on a printed circuit board (PCB) 3/5" wider than the DIP to be inserted such that the SIP is on the far edge of the PCB. A second SIP solder tail socket is placed in the PCB where a DIP socket would have to fit to replace both SIPs. A second type of SIP (one with integrated circuit (IC) pin terminations instead of solder tails) is placed parallel and adjacent to the solder tail SIPs such that DIP spacing is maintained for the new SIPs also. All SIPs are soldered in place. Between the SIPs is sufficient space to insert one to four IC DIPs with a profile no higher than the solder tail SIPs. All the above may be accomplished with exisitng parts now available through commercial outlets.

A detailed example of the embodiment of this invention described above is shown by FIGS. 1–4. Referring to FIG. 1 in-circuit modification device 11 comprises the structure of the invention. It is shown interfacing microprocessor 10 and microcomputer 12. In-circuit modification device 11 is seen to consist of printed circuit board 13, SIP header pin devices 14, 15, 16, 17, and IC component 18. Microprocessor 10 has dual in line pins 22 that plug into SIP header pin devices 14, 15. Microcomputer 12 (not completely shown) includes printed circuit board 19 and header pin recepticals 20, 21 that function as a socket to receive the header pins from header pin devices 16, 17. It is to be noted that in the present state of the art, without this in-circuit modification device of the invention, the dual in line pins of microprocessor 10 would plug directly into header pin recepticals 20, 21 of microcomputer 12.

Figure 4:
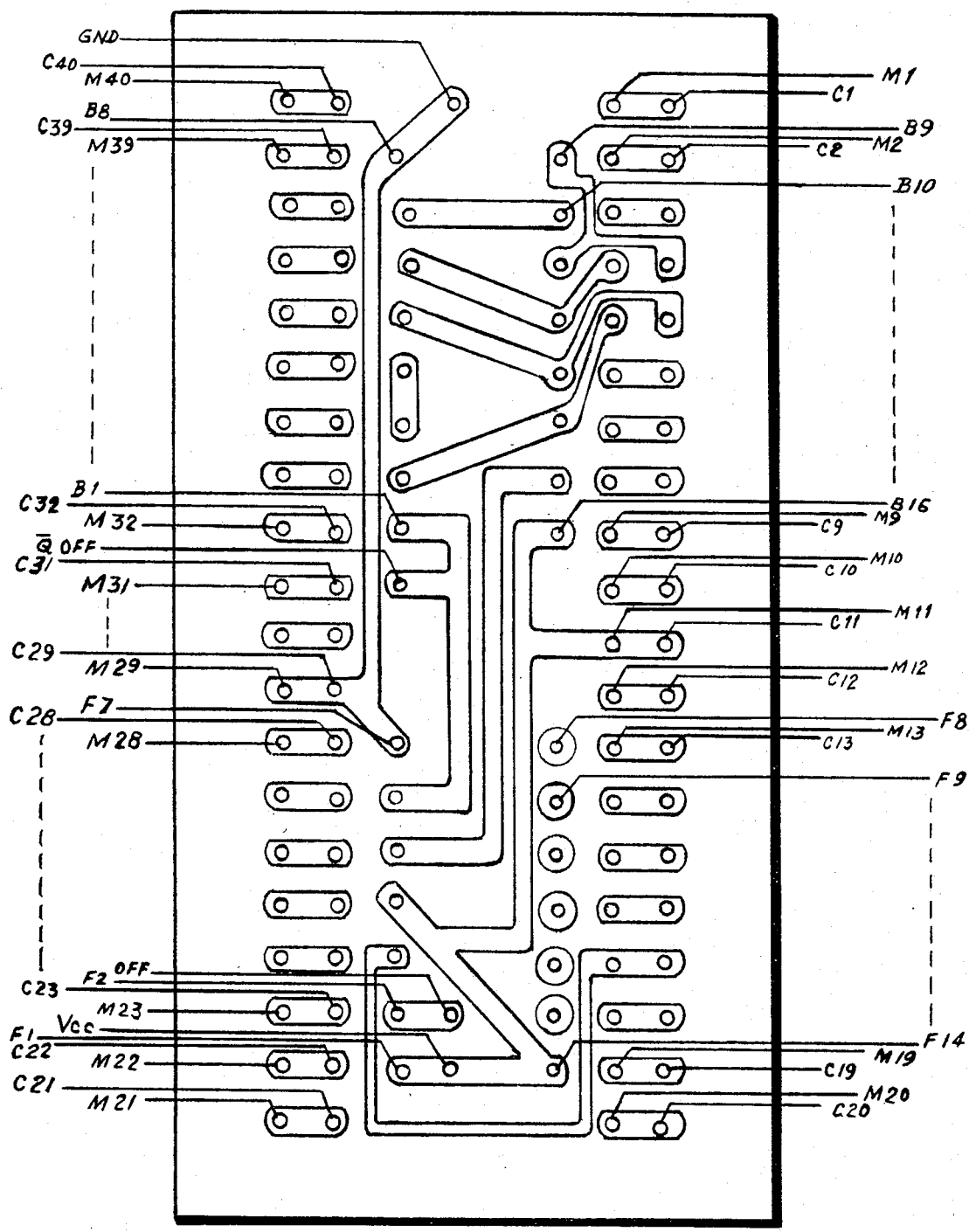
FIG. 4 is a sectional view taken at 4—4 of the device shown in FIG. 1 illustrating the bottom (printed circuit) surface of the circuit modification device of the invention.

In-circuit modification device 11 is illustrated in greater detail by the sectional view of FIG. 3. Although the ensuing detailed description identifies specific components, it is to be understood that many other components and parameters are also suitable and the scope of the invention is intended to encompass all such equivalents and modifications. For instance, any sheet member of insulating material can be used instead of printed circuit board 13 and individual header pins and hard wired connections can be used to replace the SIP devices and printed circuit. For a second instance, hybrid dip packages, built as flat pack to the dip piggy-backed on it, and with standard dip pins beneath it, can be used instead. Referring now to FIG. 3, by way of example, PC board 13 can be a 1/32 inch printed circuit board upon which are mounted SIP header pin devices 14, 15, 16, 17. Header pin devices 14, 15 are 510 AG 90D-20 catalog items and header pin devices 16, 17, are 510 AG 44D-20 catalog items commercially available from AUGAT Co. Header pin devices 14, 15 have solder tail pins 26 encapsulated in insulating material and header pin devices 16, 17 have IC pin terminations also encapsulated in insulating material. IC component 18 has conventional DIP pin terminations that extend through printed circuit board 13. It is pointed out that the dimensions of these components are such that it is possible to mount IC component 18 (and other IC components) between header pin devices 15, 16 without compromising manufacturer's size and space specifications. After all components have been mounted on the PC board as shown their pins are connected to the printed circuit 25 as shown in FIG. 4. Connection of all pins by hard soldering results in a rugged device that meets the requiremts for military application.

FIG. 2 is a top view of the in-circuit modification device of the invention. SIP header pin device 15 has 20 header pins designated M1–M20 and SIP header pin device 14 has 20 header pins designated M21–M40. Microprocessor 10 is a DIP microprocessor Z80 having 40 pins. Pins 1–40 of the microprocessor plug respectively into header pins M1–M40. SIP header pin device 17 has 20 header pins designated C1–C20 and SIP header pin device 16 has 20 header pins designated C21–C40. Microcomputer 12 is a Tandy TRS-80 and has 40 pin recepticals. Pins 1–40 of the microcomputer receives respectively header pins C1–C40. IC component 18 is a 7474 D flip flop and has 14 pins 24 designated F1–F14. IC component 30 is a 74368 buffer inverter and has 16 pins 24 designated B1–B16. All pins extend through the PC board and are interconnected by the printed circuit as shown by FIG. 4.

Referring to FIG. 4, the printed circuit disclosed thereby effect remapping shown in the following Table I.

TABLE I

| Before | After |
| --- | --- |
| 64K | 0 |
| to | to |
| 48K | 16K |
| 48K | 16K |
| to | to |
| 32K | 32K |
| 32K | 32K |
| to | to |
| 16K | 48K |
| 16K | 48K |
| to | to |
| 0 | 64K |

The remapped memory uses the same circuits for refresh, device controls, etc. as "before". Address changes are at the microprocessor itself, and appear to user as the "after" diagram, physical addressing is as before, therefore no loss of function in memory mapped 1/0 occurs; just the addresses appear different to the user.

Figures 5, 6, 7:
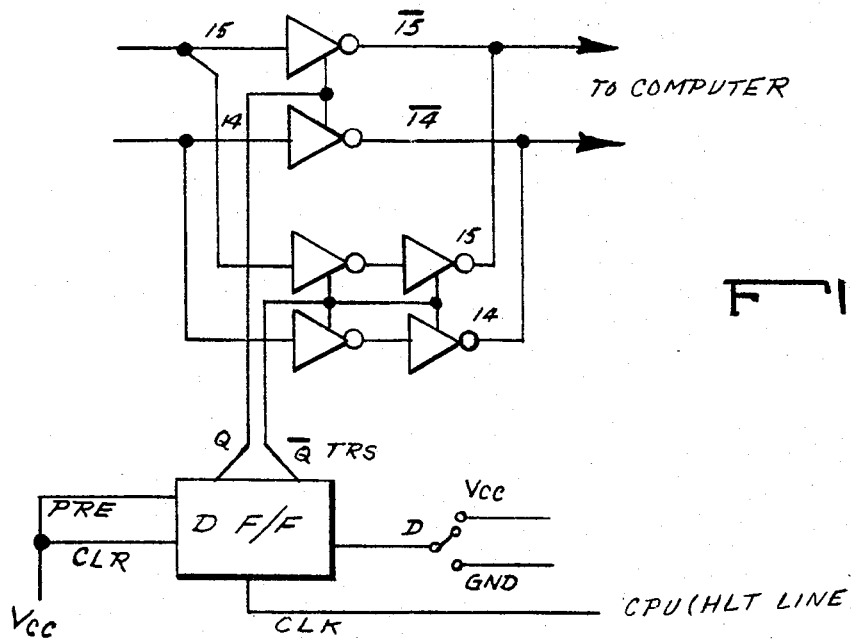
FIG. 5 is a schematic of the IC components utilized in a preferred embodiment of the invention.
FIG. 6 illustrates before and after memory mapping of the microcomputer utilized in the preferred embodiment of the invention.
FIG. 7 is a truth table for the D flip flop IC component utilized in the preferred embodiment.

FIG. 5 is a schematic showing the reconfiguration of IC components 18 and 30, FIG. 6 is a memory map of microcomputer 12 and FIG. 7 is a Truth Table for IC component 18.

In FIG. 4, the Q and $\overline{Q}$ are taken off board to provide controls for an auxillary memory which replaces the 12K ROM in the TRS-80. It is feasible to control many memory blocks by enabling a memory-mapped switch panel in this 12K. The D-Flip Flop is only 178 used, and might control other functions, if desired, such as latched input for the control D-Flip Flop from the Audio Out Port FF. Alternatively, a RAM could be implemented (4×4) in TTL that is selected by the a chip to provide memory remapping dynamically. If a second RAM is defined for each accessing page to select the proper memory map page, dynamic addressing beyond 64K is possible in a 16-bit address computer. A more sophisticated embodiment of the invention can be accomplished by means of a thick film digital DIP constructed along the same general lines outlined above wherein the inserted IC DIP is denuded to several IC chips mounted on a single or multiple PCB substrate which contains all the functions outlined above.

To accomplish hard mounting of DIP devices, the solder tail SIPs may be replaced by open SIP solder tails (no encapsulation of each pin socket) to permit soldering of DIP to the package.

While the invention has been described in one presently preferred embodiment, it is understood that the words which have been used are words of description rather than words of limitation and that changes within the purview of the appended claims may be made without departing from the scope and spirit of the invention in its broader aspects.

What is claimed is:

1. In a dual in line packaged large scale integration device having first and second rows of pins that plug into a companion device socket, the improvement residing in a circuit modification device, said circuit modification device comprising
   a printed circuit board,
   first and second rows of spaced apart header pins mounted on said printed circuit board, said rows of header pins constituting a socket and being positioned to receive respectively the first and second rows of pins of said large scale intergrating device, said first and second rows of spaced apart header pins being comprised of first and second single in line packaged solder tail devices,
   a first row of feedthrough pins juxtaposed with said first row of header pins and comprising a feedthrough pin for each header pin therein, said first row of feedthrough pins comprising a single in line packaged device having integrated circuit pin terminals,
   a second row of feedthrough pins juxtaposed with said second row of header pins and comprising a feedthrough pin for each header pin therein, said second row of feedthrough pins comprising a single in line packaged device having integrated circuit pin terminals, said first and second rows of feedthrough pins extending through said printed circuit board and constituting a plug connection to mate with said companion device socket,
   electrical connection means interconnecting header pins and feedthrough pins in a preselected arrangement, said electrical connection means comprising a discrete printed circuit on said printed circuit board, and
   at least one integrated circuit component having connector pins mounted on said printed circuit board between said first row of header pins and said second row of feedthrough pins, said integrated circuit component connector pins extending through said printed circuit board, said connector pins being electrically interconnected with said feedthrough pins in a preselected arrangement.

2. A circuit modification device as defined in claim 1 wherein said large scale integration device comprises a microprocessor means and said companion device comprises a computer means.

3. A circuit modification device as defined in claim 2 wherein said microprocessor means is a Z80 microprocessor and said computer means is a TRS-80 microcomputer.

4. A circuit modification device as defined in claim 3 wherein said integrated circuit components comprise a D flip flop 7474 integrated circuit device and an inverter buffer 74368 integrated circuit device.

5. A circuit modification device as defined in claim 4 wherein:
   said first single in line packaged soldertail socket device has 20 pin receptacles designated MI-M20;
   said second single in line packaged soldertail socket device has 20 pin receptacles designated M21-M40;
   said Z80 microprocessor has 40 terminal pins designated 1-40, said microprocessor terminal pins 1-40 mating respectively with first and second single in line packaged socket receptacle M1-M40;
   said companion device socket has 40 pin receptacles designated 1-40;
   said first single in line packaged device having integrated circuit pin terninals has 20 terminals designated C1-C20;
   said second in line packaged device having integrated circuit terminals has 20 terminals designated C21-C40, said integrated circuit terminals designated C1-C40 mating respectively with companion device socket pin receptacles designated 1-40;
   said D flip flop 7474 integrated circuit device has 14 terminal pins designated F1-F14, a terminal pin designated D-flip flop, and a terminal pin designated Vcc; and
   said inverter buffer 74368 integrated circuit device has 16 terminal pins designated B1-B17; and,
   wherein said printed circuit effects the pin interconnections: M1-C1, M2-C2, M3-C3, M4-B12-B6, C4-B11--B9, C5-B13-B5, M5-B14-B2, Mc-B6, M7-C7, M8-C8, M9-C9, M10-C10, M11-C11-B16-F14-Vcc-F1-F4, M12-C12, M13-C13, M14-C14, M15-C15, M16-C16, M17-C17-F3, M18-C18, M19-C19, M20-C20, M21-C21, M22-C22, M23-C23, F2-DFF, M24-C24, M25-C25, M26-C26, C27-C27, M28-C28, M29-F7-C29-ground, M30-C30. M31-C31, M32-C32, M33-C33, M34-C34, M35-C35, M36-C36, M37-C37, M38-C38, M39-C39, M40-C40.

* * * * *